United States Patent [19]
Wessels et al.

[11] Patent Number: 6,118,571
[45] Date of Patent: *Sep. 12, 2000

[54] THIN FILM ELECTRO-OPTIC MODULATOR FOR BROADBAND APPLICATIONS

[75] Inventors: Bruce W. Wessels, Wilmette; Seng Tiong Ho, Wheeling; Gregory M. Ford; Douglas M. Gill, both of Evanston, all of Ill.

[73] Assignee: Northwestern University, Evanston, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 09/033,536

[22] Filed: Mar. 2, 1998

Related U.S. Application Data

[63] Continuation-in-part of application No. 08/491,672, Jun. 19, 1995, Pat. No. 5,753,300.

[51] Int. Cl.[7] ................................. G02F 1/07; G02F 1/00
[52] U.S. Cl. ........................ 359/245; 359/246; 359/321
[58] Field of Search ..................... 359/245, 246, 359/321, 322, 323, 324, 315, 254; 385/3

[56] References Cited

U.S. PATENT DOCUMENTS

| | | | |
|---|---|---|---|
| 4,491,393 | 1/1985 | Roelants | 359/245 |
| 4,607,917 | 8/1986 | Ebner et al. | 359/323 |
| 4,707,081 | 11/1987 | Mir | 359/323 |
| 4,802,741 | 2/1989 | Kaukeinan | 359/245 |
| 5,526,169 | 6/1996 | Kikuchi et al. | 359/245 |
| 5,567,979 | 10/1996 | Nashimoto | 257/627 |
| 5,576,879 | 11/1996 | Nashimoto | 359/248 |
| 5,753,300 | 5/1998 | Wessels et al. | 427/126.3 |
| 5,759,265 | 6/1998 | Nashimoto et al. | 117/105 |
| 5,776,621 | 7/1998 | Nashimoto | 428/688 |
| 5,835,254 | 11/1998 | Bacon | 359/254 |

FOREIGN PATENT DOCUMENTS

| | | | |
|---|---|---|---|
| 5-019222 | 1/1993 | Japan | 359/245 |
| WO 90/10887 | 9/1990 | WIPO | 359/245 |

OTHER PUBLICATIONS

Sputtering Preparation of Ferroelectric PLZT Thin Films and Their Optical Applications; IEEE Trans. on Ultrasonics, Ferroelectrics, and Freq. Cont., vol. 38, No. 6, Nov. 1991; pp. 645–655.

Transmission Line Aspects of the Design of Broad–Band Electro–Optic Traveling–Wage Modulators; J. of Lightwave Tech, vol. LT–5. No. 3, Mar., 1987; pp. 316–319.

$BaTiO_3$ Thin Films for Electro–Optic and Non–Linear Optical Applications; Proc. MRS Sym BB, vol. 415; 1996, 8 pages.

Thin Film Channel Waveguides Fabricated in Metalorganic Chemical Vapor Deposition Grown $BaTiO_3$ on MgO; Appl. Phys. Lett. 69 (20), Nov. 11, 1996; pp. 2968–2970.

Thin–Film Channel Wavegoude Electro–Optic Modulator in Epitaxial $BaTiO_3$; Appl. Phys. Lett. 71 (13), Sep. 29, 1997; pp. 1783–1785.

Electro–Optic Materials by Solid Source MOCVD; Mater. Res. Symp. Proc. 335, 299 (1993).

Ferroelectric Properties of Thin Strontium Barium Niobate Films; Ferroelectrics, 1985, vol. 63, pp. 235–242.

(List continued on next page.)

*Primary Examiner*—Georgia Epps
*Assistant Examiner*—Ricky Mack

[57] ABSTRACT

Electro-optic modulator comprises a substrate having an epitaxial, preferentially oriented, low scattering loss thin ferroelectric film waveguide deposited by metalorganic chemcial vapor deposition on the substrate, and first and second strip electrodes on the waveguide with the electrodes spaced apart to establish an electric field effective to render the waveguide modulating to light in response to applied bias or voltage.

13 Claims, 4 Drawing Sheets

OTHER PUBLICATIONS

Development and Modification of Photorefractive Properties in the Tungsten Bronze Family Crystals; Optical Engineering, May, 1987, vol. 26 No. 5, pp. 392–404.

Preparation of Strontium Barium Niobate by Sol–Gel Method; J. Am Ceram. Soc. 75(6), 1992; pp. 1697–1700.

Sol–Gel Processing of Strontium–Barium Niobate Ferroelectric Thin Film;J. Mater. Res., vol. 5, No. 5, May, 1990; pp. 916–918.

Epitaxial Growth of Ferroelectric T.B. $Sr_{1-x}Ba_xNb_2O_6$ Films for Optoelectronic Applications; Mat. Res. Bull., vol. 22, pp. 1095–1102, 1987.

Growth Studies of Ferroelectric Oxide Layers Prepared by Organometallic Chemical Vapor Deposition; J. of Crystal Growth 107 (1991), pp. 712–715.

Growth of (001)—Oriented SBN Thin Films by Solid Source MOCVD; Mat. Res. Soc. Symp. Proc. vol. 335, 1994; pp. 59–65.

Chemical Vapor Deposition of Strontium–Barium–Niobate; Mat. Res. Soc. Symp. Proc. 243, 457 (1993); 6 pages.

Monlinear Optical Properties of Textured Strontium Barium Niobate Thin Films Prepared by Metalorganic Chemical Vapor Deposition; Appl. Phys. Lett. 66 (14), Apr. 3, 1995;1726–1728.

ABSTRACT: NONE

THIN FILM ELECTRO-OPTIC MODULATOR FOR BROADBAND APPLICATIONS

This application is a continuation-in-part of Ser. No. 08/491,672 filed Jun. 19, 1995 now U.S. Pat. No. 5,753,300.

CONTRACTURAL ORIGIN OF THE INVENTION

This invention was made with Government support by AFOSR/ARPA under award No.: F49620-96-1-0262 and the MRSEC program of the National Science Foundation at the Materials Research Center of Northwestern University under award No.: DMR-9632472. The Government may have certain rights in the invention.

FIELD OF THE INVENTION

The present invention relates to an electro-optic modulator having a ferroelectric oxide thin film waveguide and electrode structure for modulating light for broadband applications.

BACKGROUND OF THE INVENTION

Thin film ferroelectric oxides offer unique physical characteristics potentially superior to diffused waveguides fabricated from bulk ferroelectric materials and could dramatically improve the performance of such integrated optic devices as high speed or low voltage electro-optic modulators for broadband applications at bandwidths greater than 100 GHz for example. An electroptic thin film modulator is described in U.S. Pat. No. 3,944,812.

Polycrystalline ferroelectric oxide materials have considered as high dielectric constant and electro-optic thin film materials. However, ferroelectric thin film materials tend to have exceptional properties along one crystallographic direction or axis and only moderate properties along the other crystal directions or axes. Since polycrystalline ferroelectric thin films considered to-date are comprised of randomly oriented grains, the measured dielectric constant and electro-optic coefficients of these films will be an average of the properties in all directions. Thus, the average dielectric constant and electro-optic coefficient of polycrystalline ferroelectric thin films will be considerably less than those exhibited along the optimum crystal direction or axis of the crystal lattice. Higher electro-optic coefficients enable electro-optic moudlators that operate at lower voltage or higher speeds.

Strontium barium niobate ($Sr_xBa_{1-x}Nb_2O_6$) where x is greater than 0.25 and less than 0.75 (hereafter SBN) is a ferroelectric material exhibiting excellent dielectric and electro-optic properties which are highest along the c-axis of the tetragonal tungsten bronze crystal lattice as described by Prokhorov et al. in Ferroelectric Crystals for Laser Radiation Control, (Adam Hilger, N.Y., 1990) p. 81. Initial studies of $Sr_xBa_{1-x}Nb_2O_6$ were carried out on Czochralski-grown single crystals as described by Neurgaonkar et al. in Ferroelectrics 15, 31 (1984).

Potassium niobate ($KNbO_3$) is a ferroelectric material for electro-optic (EO), nonlinear optic (NLO) and photorefractive applications. The electro-optic figure of merit is 13 picometers/volt which surpasses that of $LiNbO_3$. In addition, potassium niobate possesses excellent non-linear optical coefficients ($d_{31}$=15 picometer/volt and $d_{33}$=27 picometer/volts)

$BaTiO_3$ is another ferroelectric oxide material that is an atttactive candidate for thin film integrated optics due to its large elecro-optic coefficient of 1640 pm/V in the a-axis of the crystal lattice.

The realization of an electro-optic modulator utilizing a thin ferroelectric film waveguide that effectively modulates light in a manner that offers potential commercial applications has not been achieved. Stringent requirements of low optical loss (e.g. 1 dB/cm nominally required) and bulk-like electro-optic and non-linear optical coeffficients of the thin film ferroelectric oxide waveguide have not been achieved in an electro-optic modulator.

An object of the present invention is to provide for the first time an electro-optic modulator having an oriented thin ferroelectric film waveguide metalorganic chemical vapor deposited with preferential crystal axis orientation effective to modulate light in response to applied bias or voltage.

SUMMARY OF THE INVENTION

The present invention provides in one embodiment an electro-optic modulator comprising a substrate, a thin ferroelectric film waveguide deposited by metalorganic chemical vapor deposition (MOCVD) on the substrate to have a preferential orientation of a desireable crystallographic axis of the ferroelectric material, and an electrode structure for applying a bias or voltage across the waveguide to establish an electric field strength effective to modulate light by phase retardation in response to the applied bias or voltage to the waveguide. The substrate has a lower refractive index than that of the thin film waveguide to confine light in the waveguide. Preferably, the thin film waveguide is deposited on a crystallographically oriented substrate such that the waveguide is deposited epitaxially on the substrate.

In a particular embodiment of the invention, the electro-optic modulator comprises a substrate having an epitaxial, preferentially oriented, low scattering loss thin ferroelectric oxide film waveguide deposited by metalorganic chemical vapor deposition on the substrate to a waveguide thickness in the range of 0.3 to 5 microns. Electrodes are disposed on the waveguide and spaced apart to establish an electric field therein effective to render the waveguide modulating to light throughput by phase retardation in response to applied bias or voltage.

The thin ferroelectric waveguide may comprise a barium titanate, potassium niobate, strontium/barium niobate, and other ferroelectric material having desireable electro-optic properties.

The electro-optic modulator preferably is operable to modulate light at high speeds such as, for example, at applied bias frequencies to 100 GHz and higher or at lower speeds of for example 0.1 MHz.

DESCRIPTION OF THE INVENTION

The following detailed description of the invention is offered for purposes of illustrating the present invention in greater detail and not limiting the scope of the invention.

Figure 1:
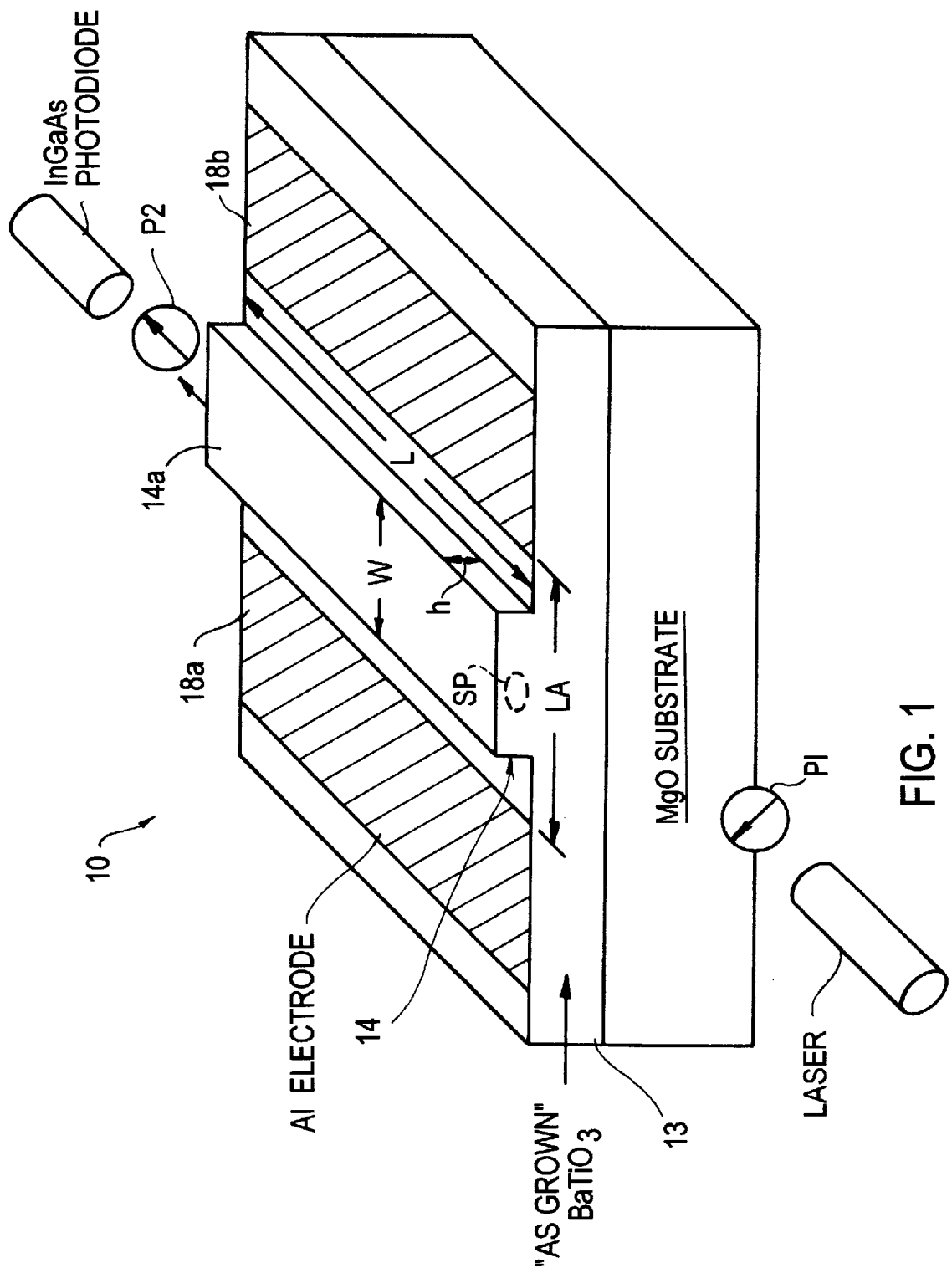
FIG. 1 is a perspective view of an electro-optic modulator having a thin ferroelectric film waveguide and electrode structure effective to modulate light in response to applied voltage in accordance with an embodiment of the invention.

Referring to FIG. 1, electro-optic modulator 10 in accordance with an illustrative embodiment of the invention comprises a single crystal MgO substrate having a (001) crystal orientation. The invention is not limited to this substrate and other crystalline substrates can used such as including, but not limited to, $LaAlO_3$, $Al_2O_3$ and other substrates with lower refractive index as compared to that of the film to confine light in the waveguide. The invention also can be practiced using amorphous or non-oriented (polycrystalline) substrates provided the films deposited thereon have a preferred crystal lattice orientation.

Typical illustrative dimensions of the substrate for the electro-optic modulator 10 described and tested below described below were 10 mm width, 10 mm length, and 0.2 mm thickness (where mm is millimeters), although the invention is not limited to any particular substrate dimensions.

An epitaxial, preferentially oriented, low scattering loss thin ferroelectric oxide film 13 is deposited by low pressure metalorganic chemcial vapor deposition on the substrate using suitable metalorganic precursors, high purity argon carrier gas, and high purity oxygen bubbled through deionized water as the reactant gas to react with the metalorganic precursors. The film can be undoped or doped with a rare earth element, such as erbium, to provide an optically active waveguide.

To deposit a $BaTiO_3$ thin film described below, the metalorganic presursors comprised titanium tetra-isopropoxide and barium hexafluoracetylacetonate$_2$tetraglyme (BaHFA) and deposition parameters set forth below as follows:

| | |
|---|---|
| Growth Temperature | 725 degrees C. for 1 hour |
| Substrate | (100) MgO |
| Pressure | 4 torr |
| Temp. - BaHFA source | 100–118 degrees C. |
| Temp. - Ti isopropoxide source | 20 degrees C. |
| Total Flow Rate | 120 sccm |
| Flow Rate Over Solid BaHFA source | 28–35 sccm |
| Flow Rate Through Ti source | 10 sccm |
| Oxygen flow rate | 50 sccm |
| Deposition rate | 100 nm/hour |

Metalorganic chemical vapor deposition apparatus described by L. A. Wills et al. in *J. Cryst. Growth*, 107, 712 (1991), the teachings of which are incorporated herein by reference, can be modified and used in the practice of the present invention to deposit the thin ferroelectric film 13 on the substrate with a high degree of preferential alignment of a crystal axis of the ferroelectric material normal to the substrate surface plane.

Figure 4:
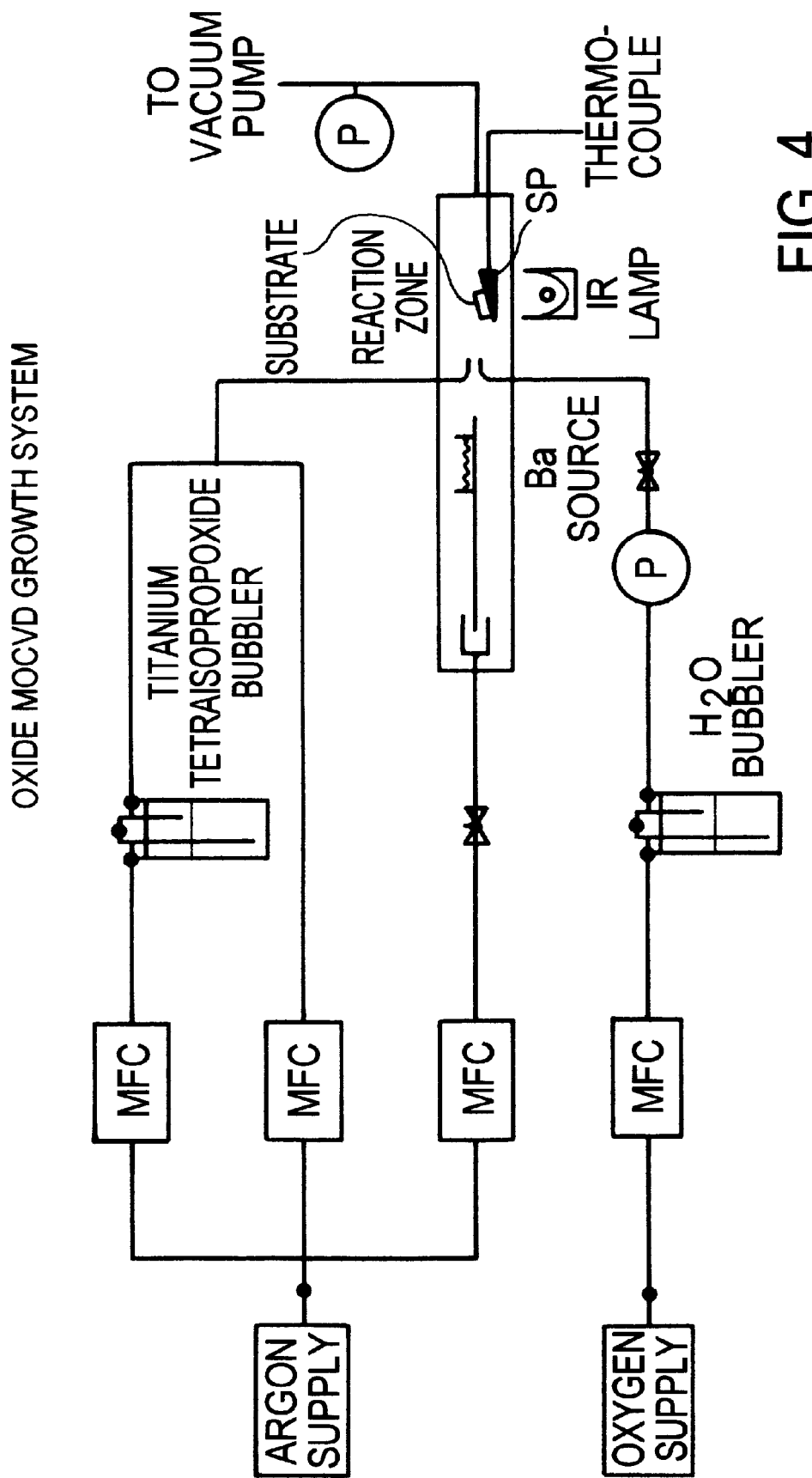
FIG. 4 is a schematic illustration of MOCVD apparatus for depositing the waveguide on the substrate.

Apparatus to this end is shown schematically in FIG. 4 and comprises a low pressure, two-zone horizontal quartz reactor system having a reactor zone that is provided with particular reactants (metalorganic precursors) in suitable proportions for reaction under the temperature and relatively low pressure conditions in the reaction zone to deposit or grow the thin ferroelectric film on the substrate.

The barium hexafluroacetylacetonate$_2$ tetraglyme solid source (prepared pursuant to G. Malandrino et al., Applied Physics Letters, vol. 58, page 182 (1991)) was placed in a reactor source zone in the manner shown in FIG. 4 and resistively heated. The liquid titanium isopropoxide was stored in a bubbler that was heated by a recirculating bath (not shown). Argon (high purity) was used as a carrier gas to bring the metalorganic precursors into the reactor zone in proper proportions. The argon and oxygen flow rates were controlled by mass flow controllers (MFC). Pressure gages P were used at appropriate locations of the apparatus. The reactor pressure was set by the total flow rate. An IR (infrared radiation) lamp was used to heat a SiC coated susceptor SP on which the substrate is placed in the reaction zone to provide an appropriate substrate film growth temperature of about 725 degrees C. for barium titanate. The deposition temperature was monitored by chromel-alumel thermocouple placed inside the susceptor.

For purposes of illustration and not limitation, an as-deposited oriented $BaTiO_3$ thin ferroelectric film 13, from which the waveguide 14 is formed, can be deposited using the deposition parameters described above to a thickness of approximately 0.32 micron. X-ray diffraction of the as-grown thin film indicated that the film was phase pure $BaTiO_3$ with the a-axis (100) aligned normal to the plane (upper surface) of the thin film. The a-axis of the $BaTiO_3$ thin film exhibits a high electro-optic coefficient so as to optimize performance of the electro-optic modulator 10. The epitaxial, highly oriented thin $BaTiO_3$ (or other ferroelectric) film will exhibit near bulk non-linear optical properties; i.e. non-linear optical properties approaching closely (e.g. within 50%) those exhibited by like ferroelectric material in bulk form. Diffractmeter measurements indicated single, broad (h00) peaks with no tetragonal splitting. The measured in-plane lattice parameter was 4.011 Angstroms. Epitaxial alignment of the thin film waveguide 14 to the substrate was confirmed with phi scans of the off-axis [220] planes in the $BaTiO_3$ crystal lattice, and the requisite fourfold sysmmetry was observed.

The waveguide of FIG. 1 was fabricated to include a waveguide ridge 14a in the approximately 0.32 micron (320 nm) thick as-grown $BaTiO_3$ film 13, which had an as-grown root-mean-square (rms) surface roughness of 13 nm (nanometers) determined by atomic force microscopy. The as-grown film $BaTiO_3$ film 13 was mechanically planarized by conventional optical mechanical polishing using alumina or other slurry prior to photolithographic patterning to an approximate 5 nm surface roughness.

Planarizing of the film before photolithographic patterning greatly improves the optical quality by minimizing losses due to scattering of the waveguide, most likely due to an improved adhesion between the photoresist and the film surface, although applicants do not wish to be bound by any theory in this regard. Planarization also signifcantly reduces the surface scattering losses of the waveguide. The propagation loss in an approximate 300 nm thick planarized waveguide typically is approximately 5 dB/cm (B is decibel and cm is centimeters) for 1.5 micron light.

The waveguide ridge 14a was formed in the epitaxial $BaTiO_3$ film 13 by wet etching the $BaTiO_3$ film in a 1 volume % HF in water solution for 90 seconds with conventional photoresist applied to appropriate areas of the $BaTiO_3$ film. Waveguide ridge height and width were measured to be approximately 40 nm and 2 microns, respectively, using an Alpha step profilometer. In general, the height h and width w of the waveguide ridge 14a are within the range of 20 to 300 nm and 2 to 20 microns, respectively. The length L of the waveguide for example only is selected to be 0.1 cm to 1 cm. A majority (e.g. 80%) of light waveguiding occurs through the ridge 14a with a minor amount occurring in regions of the BaTiO$_3$ film 13 below and laterally in the vicinity of the ridge 14a. The total thickness of the waveguide including the ridge as formed in the BaTiO$_3$ film 13 preferably is in the range of 0.3 to 5 microns.

The electro-optic modulator 10 is shown in FIG. 1 including first and second coplanar, parallel strip electrodes 18a, 18b applied on opposite sides of the waveguide ridge 14a by conventional liftoff technique and connected to a voltage source, such as a pulse generator. The electrodes 18a, 18b typically can be 5 micron wide and 150 nm thick thermally evaporated aluminum, although the electrodes can be other materials, other dimensions, and applied to the waveguide 14 in the pattern shown in other ways. The length of the electrodes 18a, 18b generally is the same as the length of the modulator. The electrodes 18a, 18b establish an electric field therebetween in the waveguide ridge 14a and regions of the BaTiO$_3$ film 13 below and laterally in the vicinity of the ridge 14a. The electric field extends transverse to the longitidnal axis or length L of the waveguide ridge 14a and alters the refractive index of the ferroelectric oxide waveguide material (i.e the light propagation speed) and thus alters the phase of the light propagating through the waveguide as a guided wave mode. The electric field between the electrodes is more or less uniform along the length of the electrodes.

The lateral spacing LA between the electrodes 18a, 18b is controlled so that the electrodes are close enough to one another to establish an electric field in the waveguide 14 and film 13 of sufficient magnitiude (e.g. to maintain a sufficiently low or minimized VL product where V is volts and L is the length in centimeters in FIG. 1 ) effective to render the waveguide modulating to light throughput from the input end of the waveguide to the output end thereof by phase retardation in response to applied bias or voltage to the electrodes. To this end, electrode spacing LA generally is 2 to 10 microns. A preferred VL product for practicing the invention is 5 V·cm or less.

The invention is not limited to the particular electrode structure shown and can be practiced using asysmmetric coplanar strip electrode or coplanar waveguide electrode configurations as described in IEEE Journal of Quantum Electronics, Vol. QE-23 #1, pages 30–41, January, 1987.

Figure 2:
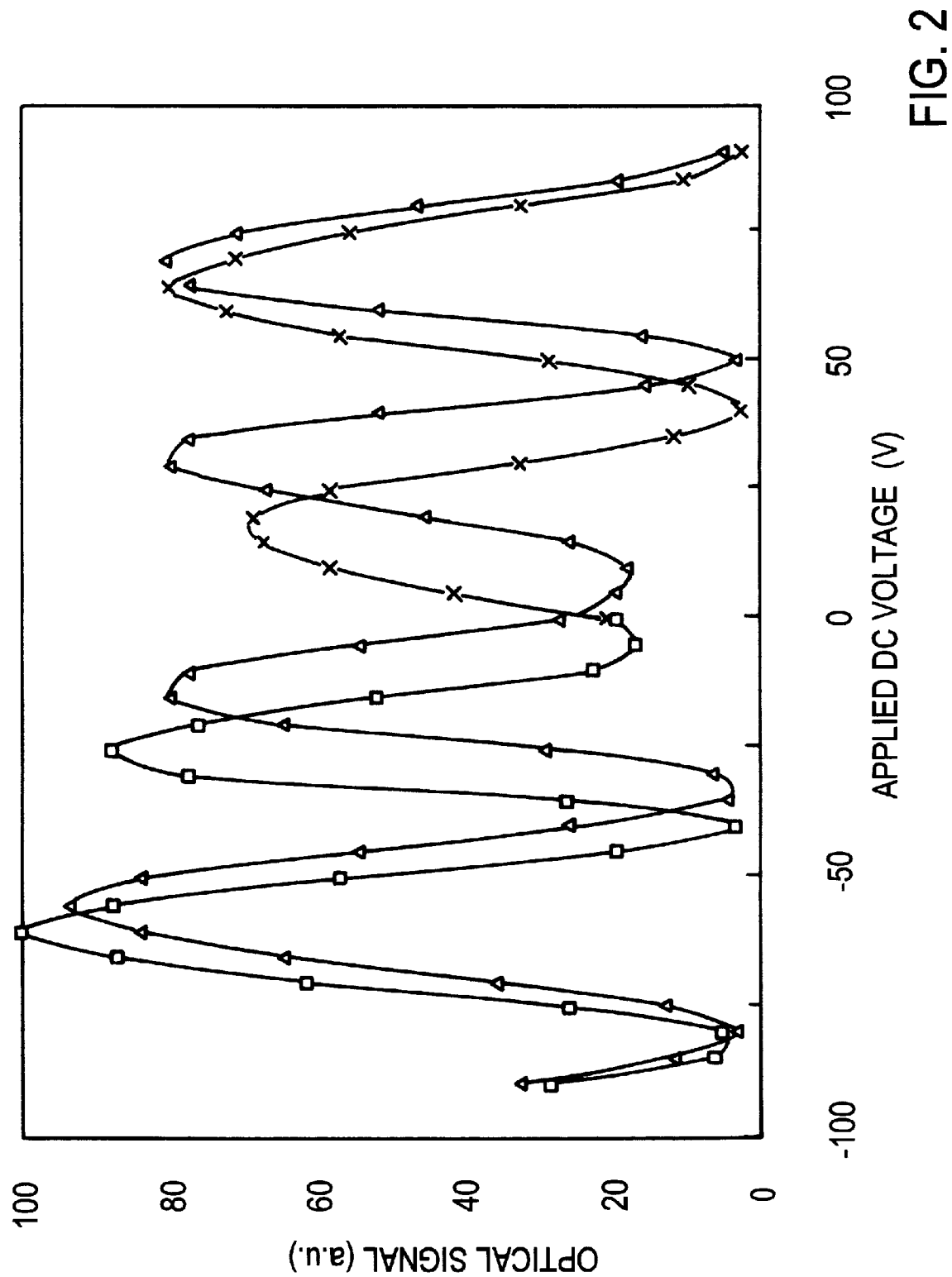
FIG. 2 is a graph illustrating amplitude modulation versus applied voltage in the modulator of FIG. 1 having an as-grown $BaTiO_3$ thin film with waveguide ridge width of 2.5 microns.

The electro-optic response of the electro-optic modulator 10 shown in FIG. 1 was measured by end firing either 1.3 or 1.5 micron coherent light, linearly polarized by polarizer P1 from a laser source at approximately 45 degrees to vertical as a spot SP (e.g. 2 micron diameter) into the input end of the waveguide ridge 14a of the modulator 10. Modulation of the signal was achieved by placing a cross polarizer P2 having 90 degree offset polarization relative to P1 at the output end of the modulator waveguide ridge and applying either a dc or dc plus ac voltage across the electrodes 18a, 18b. The light output intensity (amplitude) from the opposite output end of the waveguide 14 was analyzed by a InGaAs photodiode light detecting device. FIG. 2 shows the response of the modulator 10 to an applied dc voltage.

The data were taken as follows: a positive 100V bias (50 kV/cm) was applied to the waveguide for a few minutes prior to data acquistion (well in excess of the coercive field for the waveguide of approximately 5 V/cm), then starting at 0 V, a potential was applied to in approximate 5 V (−2.5 kV/cm) increments to −90 V (approximate −45 kV/cm) (the open square data points in FIG. 2); the potential was then incrementally increased in like increments to +90 V (the open triangle data points); and finally reduced back to zero (the X data positions).

No current flow was measured across the electrode gap with the 100 V (50 kV/cm) applied and an ammeter sensitivity of $10^{-7}$ Ampere.

At lower fields, there were small changes, over a period of hours, in the polarization of the light emerging from the output end of the waveguide, which caused relatively small (less than 10%) in the signal amplitude at the detector. It is not clear whether the changes in signal throughput were caused by domain movement or current flow between the electrodes. Higher fields (>35 kV/cm), however, produced relatively large changes in signal throughput, possibly caused by current flow and heating in the film.

The frequency ($\upsilon$) dependence of the modulator response was determined from 0 to 5 MHz by measuring the amplitude modulation of the output light using an InGaAs detector and an oscilloscope (for $0<\upsilon<500$ Hz), lock-in amplifier (for 500 Hz$<\upsilon<100$ kHz) and spectrum analyzer (for $\upsilon>100$ kHz). The applied field for the AC measurements consisted of an AC superposed on a 15 kV/cm DC field. Care was taken to ensure that the change in signal throughput was monotonic with applied voltage and that the modulation depth was less than $\pi/2$ for the lock-in amplifier and spectrum analyzer measurements.

FIG. 2 shows the modulation of 1.55 $\mu$m light as a function of applied DC voltage for a 2.5 $\mu$m wide waveguide ridge, 20 $\mu$m electrode gap and 2.7 mm long electrodes. A hysteresis in the modulator response is seen, since the throughput is dependent on whether the bias is increasing or decreasing. The hysteresis is less evident at higher field strengths. The hysteresis could result from reversible poling by the applied field and/or space charge formation in the film. Modulation depths in excess of 14 dB were measured. The modulator went from an 'on' state with a [18]30 volt bias (15 kV/cm) to an 'off' state with a [18]50 volt bias (25 kV/cm). Therefore a $\pi$ phase shift is induced between the TE and TM polarization path lengths in the waveguide with a 20±[18]2 volt change in applied bias, we call this the halfwave voltage change, $\Delta v_\pi$.

The electro-optic response of the film to the applied field is complex, and as yet, not fully understood. Presumably domain alignment dominates at lower field strengths (<15 kV/cm). Once the coercive field strength is reached the film is assumed to have a net polarization with the +c-axis parallel to the field direction. In this initial experiment we measure the relative change in the waveguide propagation indexes between the TE and TM polarizations, $\Delta n^{eff}_{TE} - \Delta n^{eff}_{TM} = \Delta n^{eff}_{TE-TM}$, under an applied field parallel to the TE polarization. Modeling of the channel waveguide structure indicates that a relative index change in the film, $\Delta n_{TE} - \Delta n_{TM} = \Delta n_{TE-TM}$, of $3.25 \times 10^{-4}$ will produce a halfwave phase shift between the TE and TM polarizations in the waveguide, this corresponds to a waveguide propagation index change of $\Delta n^{eff}_{TE-TM}$[18]$2.87 \times 10^{-4}$ as explained in [10]*(assuming a bulk index value for the film $n_{film}=2.35$ and $n_{substrate}=1.7$). The effective electro-optic coefficient of the film is then estimated assuming the change in the electric field $\Delta E_\pi \sim \Delta V_\pi/d$, where d is the electrode spacing. We also assume 100% overlap between the electric field and the film. These assumptions are reasonable since the dielectric constant of the film is much higher than that of the substrate and air. It should be noted that the formation of space charge in the film could strongly reduce the actual field seen by the film, however, these effects are neglected here. The effective electro-optic coefficient is defined to be $$\Delta r^{eff} = \quad \text{(Eq 1)}$$

$$r_{TE}^{eff} - r_{TM}^{eff} = \frac{1}{\Delta E_\pi} \left\{ \left( \left(\frac{1}{n_{TE}^\pi}\right)^2 - \left(\frac{1}{n_{TE}}\right)^2 \right) - \left( \left(\frac{1}{n_{TM}^\pi}\right)^2 - \left(\frac{1}{n_{TM}}\right)^2 \right) \right\}$$

where $n_{TE\,(TM)}$ and $n^\pi_{TE\,(TM)}$ are the refractive indices of the TE(TM) polarization before and after the $\Delta V_\pi$ change in the applied voltage, respectively. Therefore by [12]*, $$\Delta r^{eff} \approx \frac{2\Delta n_{TE-TM}}{\Delta E_\pi (n_{film})^3} \quad \text{(Eq 2)}$$

This yields an effective DC electro-optic coefficient of $\Delta r^{eff}$~50±5 pm/V for the film. It should be noted that the effective electro-optic coefficient contains the field induced index changes from domain poling, domain wall movement and the linear electro-optic effect. Similar results were found for 1.3 μm light.

The BaTiO$_3$ thin film showed both linear and quadratic electro-optic responses when the modulator was operated with an AC bias superposed on a DC bias. At ~0 volts DC bias the film showed a relatively weak quadratic electro-optic response. As the DC bias was increased the electro-optic response became much stronger and linear, since higher order harmonic components in the modulated signal were not observed.

Figure 3:
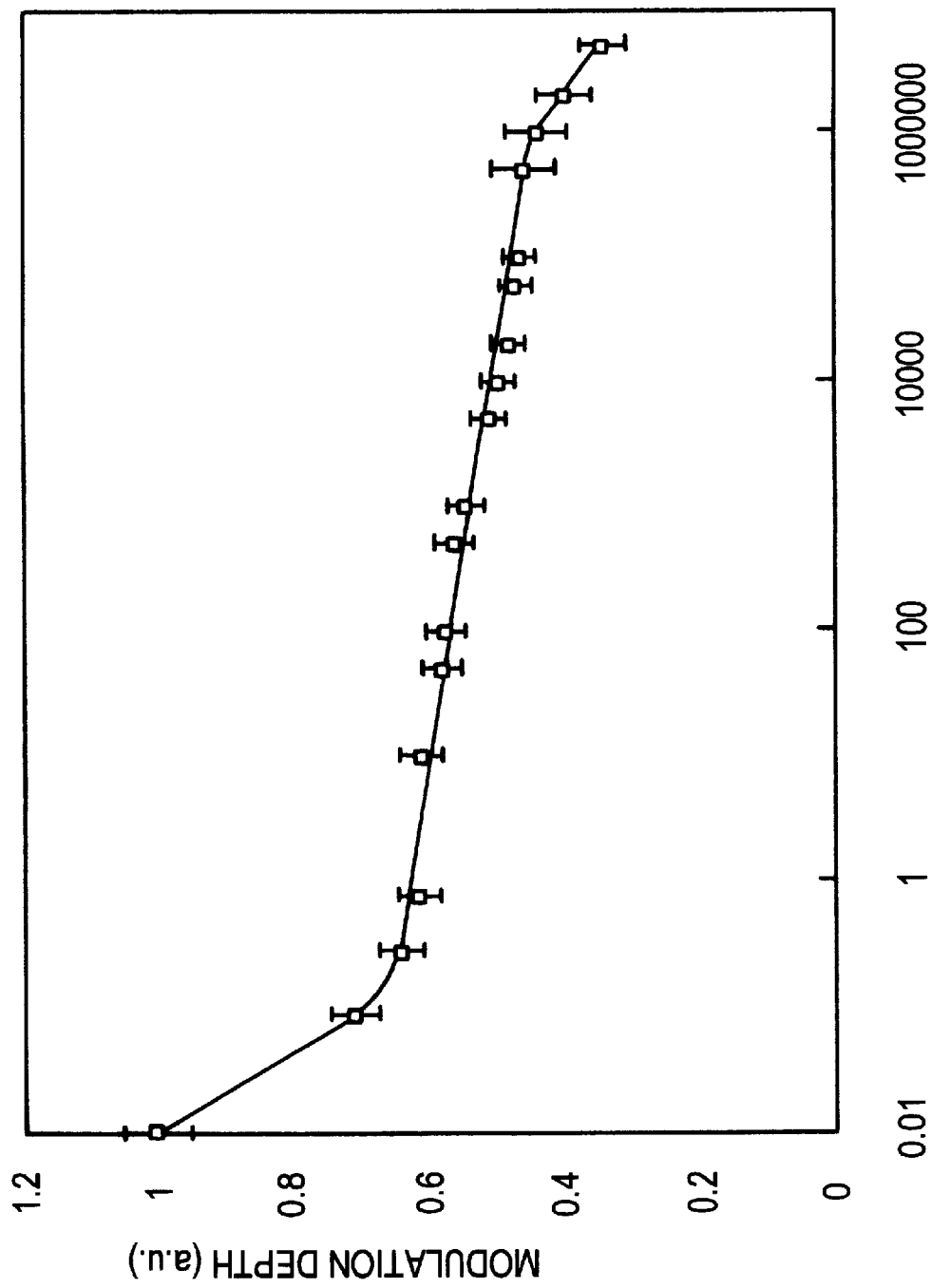
FIG. 3 is a graph of modulation depth versus frequency for 1.55 micron light in a 7 micron wide waveguide with 1.6 mm long strip electrodes of FIG. 1, 20 micron electrode spacing or gap, 30 V dc bias and a 22 V peak-to-peak ac bias.

Modulation depth as a function of frequency is shown in FIG. 3 (for 1.3 μm light in a 7 μm wide waveguide with 1.6 mm long electrodes, 20 μm electrode gap, 30 volt (15 kV/cm) DC bias, and a 22 volt (11 kV/cm) peak-to-peak AC bias). The modulation depth decreases to ~60% of the DC value when operated at ~1 Hz, at 20 kHz the modulation depth is ~50% of the DC value, and from 20 kHz to 5 MHz the modulation depth shows a slower roll-off to ~37% of the DC value. Modulation of the signal was observed at frequencies in excess of 5 MHz. The data indicates that several mechanisms contribute to the measured electro-optic effect, evidenced by the changing slope in FIG. 3. The large drop in $r_{eff}$ from DC to 1 Hz operation is presumably caused by the slow response of the domain reorientation in the film. The more modest drop from 1 Hz>υ>20 kHz, and 20 kHz >υ>5 MHz is most likely indicative of more subtle domain wall movement. We did not see any fatigue effects. There was also no degradation in modulator performance from repeatedly reversing the applied bias or after months of testing. However, we did see a degradation in modulator performance that seemed to be related to high humidity, which was eliminated by baking the structure at ~120° C. Higher frequency measurements are needed to determine the relative contribution to the modulation from the linear electro-optic effect.

The measured properties of the thin film BaTiO$_3$ electro-optic modulator can be used to calculate the performance of a more optimized device. Previous measurements of waveguide output spot size verses waveguide width indicate that a 5 μm electrode spacing could easily be used for a 2.5 μm wide waveguide. Therefore, a 2.5 μm wide waveguide modulator with 1 cm long electrodes and a 5 μm electrode gap should have a DC half wave voltage of 1.35 volts with a bias of 2 volts in an 'as grown' film. This corresponds to a VL product of 1.35 V·cm, we estimate the VL product at 5 MHz to be ~4 V·cm. Additional measurements at 100 MHz indicate comparable VL products.

In conclusion, a simple channel waveguide modulator has been fabricated in epitaxial BaTiO$_3$ on MgO. Electro-optic modulation of 1.3 and 1.55 μm light was demonstrated. Films had an effective electro-optic coefficient, $\Delta r_{eff}$, of ~50±5 pm/volt for applied DC voltages and ~18±2 pm/volt at 5 MHz. Epitaxial thin film BaTiO$_3$ therefore offers the potential for low-voltage highly-confining guided wave electro-optic modulator structures.

For further explaination of 10* and 12* referred to above, see the following:

10* $n^{eff}_{TE(TM)}$ is the effective propagation index of the TE(TM) polarization in the composite of substrate, film, and air which comprise the volume of the propagation mode. $n^{eff}_{TE(TM)}$ is related to $n_{TE(TM)}$, the actual TE(TM) index of the film, through the guiding angle of the waveguide structure, $\theta$, such that, $n^{eff}_{TE(TM)} = n_{TE(TM)}(\cos \theta_{TE(TM)})$. We note that $\Delta n^{eff}_{TE(TM)} = n^{eff}_{TE(TM)}(\phi_\pi) - n^{eff}_{TE(TM)}(\phi_o)$ where $n^{eff}_{TE(TM)}(\phi_o)$ and $n^{eff}_{TE(TM)}(\phi_\pi)$ are the TE(TM) waveguide propagation indexes before and after the halfwave voltage change, $\Delta V_\pi$, respectively. $\Delta n^{eff}_{TE-TM} \equiv \Delta n^{eff}_{TE} - \Delta n^{eff}_{TM}$. We measure $\Delta n^{eff}_{TE-TM}$ and calculate $\Delta n_{TE-TM}$ noting that $\theta_{TE} \approx \theta_{TM} \equiv \theta$. Therefore, $\Delta n^{eff}_{TE-TM} = \Delta n_{TE}(\cos \theta_{TE}) - \Delta n_{TM}(\cos \theta_{TM}) \approx (\Delta n_{TE} - \Delta n_{TM})(\cos \theta) = \Delta n_{TE-TM}(\cos \theta)$.

12* (Eq. 1)=$[((n_{TE} + n^\pi_{TE})(n_{TE} - n^\pi_{TE})/(n_{TE}^2 \; n^{\pi 2}_{TE})) - ((n_{TM} + n^\pi_{TM})(n_{TM} - n^\pi_{TM})/(n_{TM}^2 \; n^{\pi 2}_{TM}))]/\Delta E_\pi \approx [(2n_{TE}\Delta n_{TE}/n_{TE}^4) - (2n_{TM}\Delta n_{TM}/n_{TM}^4)]/\Delta E_\pi$, $n_{TE} \approx n_{TM} = n_{film}$. Therefore, $\Delta r^{eff} \approx 2(\Delta n_{TE} - \Delta n_{TM})/\Delta E_\pi (n_{film})^3 = 2\Delta n_{TE-TM}/\Delta E_\pi (n_{film})^3$.

Although certain specific embodiments and features of the invention have been described hereabove, it is to be understood that modifications and changes may be made therein without departing from the spirit and scope of the invention as defined in the appended claims.

What is claimed is:

1. Electro-optic modulator comprising a substrate, a thin ferroelectric oxide film waveguide deposited by metalorganic chemical vapor deposition on the substrate to have near bulk nonlinear optical properties a preferential orientation of a crystallographic direction of the ferroelectric oxide, and a plurality of electrodes connected to a voltage source and spaced apart relative to said waveguide to establish a field strength effective to cause said waveguide to modulate light throughput by phase retardation in response to applied voltage.

2. The modulator of claim 1 including an input polarizer at an input end of said waveguide and output polarizer at an output end of waveguide.

3. The modulator of claim 1 wherein said thin film waveguide has a crystal axis thereof exhibiting a high electro-optic coefficient oriented preferentially in a direction generally perpendicular to a substrate surface and said electrodes.

4. The modulator of claim 1 wherein said thin film waveguide has a thickness of 0.3 to 5 microns.

5. The modulator of claim 4 wherein said waveguide comprises an elevated ridge formed on an integral ferroelectric oxide thin film and first and second strip electrodes are disposed on said thin film on opposite sides of said ridge.

6. The modulator of claim 5 wherein said electrodes are coplanar and parallel with one another and said ridge.

7. The modulator of claim 1 including a source of light at an input end of said modulator and a light detecting device at an output end of said modulator.

8. Electro-optic modulator comprising a substrate, a thin ferroelectric oxide film waveguide on the substrate, said waveguide comprising an elevated ridge formed on an integral ferroelectric oxide thin film deposited by metalorganic chemical vapor deposition and having near bulk nonlinear optical properties with a preferential orientation of a crystallographic direction of the ferroelectric oxide, and first and second strip electrodes disposed on said thin film on opposite sides of said ridge and connected to a voltage source, said electrodes being spaced apart relative to said waveguide ridge to establish a field strength effective to cause said waveguide to modulate light in response to applied voltage.

9. The modulator of claim 8 including a source of light at an input end of said modulator and a light detecting device at an output end of said modulator.

10. The modulator of claim 8 wherein the substrate is a crystallographically oriented substrate, and the waveguide is deposited epitaxially on the substrate.

11. The modulator of claim 8 wherein said thin film waveguide has a crystal axis thereof exhibiting a high electro-optic coefficient oriented preferentially in a direction generally perpendicular to a substrate surface and said electrodes.

12. The modulator of claim 8 wherein said thin film waveguide has a thickness of 0.3 to 5 microns.

13. The modulator of claim 8 wherein said electrodes are coplanar and parallel with one another and said ridge.

* * * * *

UNITED STATES PATENT AND TRADEMARK OFFICE
CERTIFICATE OF CORRECTION

PATENT NO : 6 118 571

DATED : September 12, 2000

INVENTOR(S): Bruce W. WESSELS, et al.

It is certified that error appears in the above-identified patent and that said Letters Patent is hereby corrected as shown below:

Column 8, line 37:

after "properties" insert ---and---.

Signed and Sealed this

First Day of May, 2001

Attest:

NICHOLAS P. GODICI

*Attesting Officer*  *Acting Director of the United States Patent and Trademark Office*